US011127781B2

(12) United States Patent
Thothadri et al.

(10) Patent No.: US 11,127,781 B2
(45) Date of Patent: Sep. 21, 2021

(54) METHOD OF MASKLESS PARALLEL PICK-AND-PLACE TRANSFER OF MICRO-DEVICES

(71) Applicant: Applied Materials, Inc., Santa Clara, CA (US)

(72) Inventors: Manivannan Thothadri, Mountain View, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/805,378

(22) Filed: Feb. 28, 2020

(65) Prior Publication Data
US 2020/0203423 A1    Jun. 25, 2020

Related U.S. Application Data

(62) Division of application No. 16/270,235, filed on Feb. 7, 2019, now Pat. No. 10,580,826, which is a division
(Continued)

(51) Int. Cl.
*H01L 27/15* (2006.01)
*H01L 25/075* (2006.01)
(Continued)

(52) U.S. Cl.
CPC ...... *H01L 27/156* (2013.01); *H01L 21/67144* (2013.01); *H01L 21/6835* (2013.01);
(Continued)

(58) Field of Classification Search
None
See application file for complete search history.

(56) References Cited

U.S. PATENT DOCUMENTS

| 6,961,993 B2 | 11/2005 | Oohata |
| 7,744,770 B2 | 6/2010 | Doi et al. |

(Continued)

FOREIGN PATENT DOCUMENTS

| CN | 1963672 | 5/2007 |
| CN | 101859714 | 10/2010 |

(Continued)

OTHER PUBLICATIONS

'Terecircuits.com/photoprinting.shtml' [online]. "Terecircuits," 2015, [retrieved on Sep. 6, 2017]. Retrieved from the Internet: URL<terecircuits.com/photoprinting.shtml>, 2 pages.
(Continued)

*Primary Examiner* — Jack S Chen
(74) *Attorney, Agent, or Firm* — Fish & Richardson P.C.

(57) ABSTRACT

An apparatus for positioning micro-devices on a destination substrate includes a first support to hold a destination substrate, a second support to provide or hold a transfer body having a surface to receive an adhesive layer, a light source to generate a light beam, a mirror configured to adjustably position the light beam on the adhesive layer on the transfer body, and a controller. The controller is configured to cause the light source to generate the light beam and adjust the mirror to position the light beam on the adhesive layer so as to selectively expose one or more portions of the adhesive layer to create one or more neutralized portions. The transfer body and the destination substrate are moved away from each other and one or more micro-devices corresponding to the one or more neutralized portions of the adhesive layer remain on the destination substrate.

16 Claims, 8 Drawing Sheets

Related U.S. Application Data of application No. 15/619,226, filed on Jun. 9, 2017, now Pat. No. 10,217,793.

(60) Provisional application No. 62/348,691, filed on Jun. 10, 2016.

(51) Int. Cl.

| | | |
|---|---|---|
| *H01L 33/00* | (2010.01) | |
| *H01L 33/60* | (2010.01) | |
| *H05K 3/00* | (2006.01) | |
| *H05K 3/30* | (2006.01) | |
| *H05K 13/00* | (2006.01) | |
| *H05K 13/04* | (2006.01) | |
| *H01L 21/67* | (2006.01) | |
| *H01L 21/683* | (2006.01) | |
| *H01L 33/20* | (2010.01) | |
| *H01L 33/48* | (2010.01) | |

(52) U.S. Cl.
CPC ...... *H01L 25/0753* (2013.01); *H01L 33/0095* (2013.01); *H01L 33/60* (2013.01); *H05K 3/0026* (2013.01); *H05K 3/305* (2013.01); *H05K 13/0015* (2013.01); *H05K 13/0069* (2013.01); *H05K 13/0469* (2013.01); *H01L 33/20* (2013.01); *H01L 33/48* (2013.01); *H01L 2221/68322* (2013.01); *H01L 2221/68368* (2013.01); *H01L 2221/68381* (2013.01); *H01L 2933/0033* (2013.01)

(56) References Cited

U.S. PATENT DOCUMENTS

| | | | |
|---|---|---|---|
| 8,361,268 | B2 | 1/2013 | Mizuno et al. |
| 8,476,826 | B2 | 7/2013 | Oohata et al. |
| 9,331,230 | B2 | 5/2016 | Shieh et al. |
| 9,401,298 | B2 | 7/2016 | Zakel et al. |
| 9,554,484 | B2 | 1/2017 | Rogers et al. |
| 9,862,141 | B2 | 1/2018 | Marinov et al. |
| 10,153,325 | B2 | 12/2018 | Thothadri et al. |
| 10,319,782 | B2 * | 6/2019 | Thothadri ........... H01L 33/0095 |
| 2002/0064032 | A1 | 5/2002 | Oohata |
| 2006/0007297 | A1 | 1/2006 | Doi et al. |
| 2007/0103664 | A1 | 5/2007 | Chiu |
| 2008/0122119 | A1 | 5/2008 | Kian et al. |
| 2008/0210368 | A1 | 9/2008 | Zakel et al. |
| 2010/0044596 | A1 | 2/2010 | Ishikawa et al. |
| 2010/0123268 | A1 | 5/2010 | Menard |
| 2010/0258543 | A1 | 10/2010 | Mizuno et al. |
| 2010/0259164 | A1 | 10/2010 | Oohata et al. |
| 2012/0025182 | A1 | 2/2012 | Umeda et al. |
| 2013/0130440 | A1 | 5/2013 | Hu et al. |
| 2014/0120640 | A1 | 5/2014 | Shieh et al. |
| 2014/0238592 | A1 | 8/2014 | Marinov et al. |
| 2016/0124316 | A1 | 5/2016 | Markle et al. |
| 2016/0219684 | A1 | 7/2016 | Kaskey et al. |
| 2016/0282728 | A1 | 9/2016 | Johnston et al. |
| 2017/0338199 | A1 | 11/2017 | Zou et al. |
| 2017/0358478 | A1 | 12/2017 | Thothadri et al. |
| 2017/0358623 | A1 | 12/2017 | Thothadri et al. |
| 2019/0103439 | A1 | 4/2019 | Thothadri |
| 2019/0189685 | A1 | 6/2019 | Thothadri |
| 2020/0203423 | A1 * | 6/2020 | Thothadri .............. H05K 3/305 |

FOREIGN PATENT DOCUMENTS

| | | |
|---|---|---|
| CN | 105283122 | 1/2016 |
| CN | 105493297 | 4/2016 |
| JP | 2002-118124 | 4/2002 |
| JP | 2003-005100 | 1/2003 |
| JP | 2004-299814 | 10/2004 |
| JP | 2006-163102 | 6/2006 |
| JP | 2007-025085 | 2/2007 |
| JP | 2008-122681 | 5/2008 |
| JP | 2008-535275 | 8/2008 |
| JP | 2010-251359 | 11/2010 |
| JP | 2010-251360 | 11/2010 |
| JP | 2014-515883 | 7/2014 |
| JP | 2016-504753 | 2/2020 |
| WO | WO 2010/132552 | 11/2010 |
| WO | WO 2013/010113 | 1/2013 |
| WO | WO 2014/074954 | 5/2014 |

OTHER PUBLICATIONS

International Search Report and Written Opinion in International Application No. PCT/US2017/036804, dated Sep. 18, 2017, 13 pages.

CN Office Action in Chinese Appln. No. 201780032280.6, dated Aug. 27, 2019, 12 pages (with English search report).

CN Office Action in Chinese Appln. No. 201780032280.6, dated May 7, 2020, 15 pages (with English Translation).

EP Search Report in European Application No. 17811102.7, dated Dec. 18, 2019, 9 pages.

* cited by examiner

Flexible destination substrate with RGB LEDs

METHOD OF MASKLESS PARALLEL PICK-AND-PLACE TRANSFER OF MICRO-DEVICES

CROSS-REFERENCE TO RELATED APPLICATIONS

This application is a divisional of U.S. application Ser. No. 16/270,235, filed Feb. 7, 2019, which is a divisional of U.S. application Ser. No. 15/619,226, filed Jun. 9, 2017, which claims priority to U.S. Provisional Application Ser. No. 62/348,691, filed on Jun. 10, 2016, the disclosures of which are incorporated by reference.

TECHNICAL FIELD

This disclosure generally relates to the transfer of micro-devices from a donor substrate to a destination substrate.

BACKGROUND

A wide variety of products include an array of individual devices on a substrate, with the devices addressable or controllable by circuitry on the substrate. Where the individual devices are on the micron scale, e.g., less than 100 microns across, the devices can be considered micro-devices. In general, micro-devices can be fabricated using a sequence of microfabrication techniques, such as deposition, lithography and etching, to deposit and pattern a sequence of layers.

One approach for fabricating a device that includes an array of individual micro-devices is to directly fabricate the individual micro-devices on the substrate which will form part of the product. This technique has been used, e.g., to fabricate the TFT panel and color filter panels of an active matrix liquid crystal display (LCD).

One proposed display panel technology uses an array of LEDs, with individual LEDs providing the individually controllable pixel elements. Such an LED panel can be used for a computer, touch panel device, personal digital assistant (PDA), cell phone, television monitor, and the like.

Although organic light-emitting diode (OLED) panels are in use, an LED panel that uses micron-scale LEDs based on III-V semiconductor technology (also called microLEDs) faces additional problems. In particular, depositing and growing III-V semiconductor microLEDs directly on a final display substrate poses technical and manufacturing hurdles. Moreover, microLED panels are difficult to manufacture in curved or bendable display.

SUMMARY

The present disclosure generally relates to systems and methods for surface mounting micro-devices over a large area.

In one aspect, an apparatus for positioning micro-devices on a destination substrate includes a first support to hold a destination substrate, a second support to provide or hold a transfer body having a surface to receive an adhesive layer, one or more actuators configured to provide relative motion between the first support and the second support, an illumination system configured to selectively and masklessly expose regions of the adhesive layer on the transfer body, and a controller. The controller is configured to cause the one or more actuators to create relative motion such that a plurality of micro-devices attached to the adhesive layer contact the destination substrate, cause the illumination system to selectively expose one or more portions of the adhesive layer to create one or more neutralized portions, and cause the one or more actuators to create relative motion such that the surface and the destination substrate are moved away from each other and one or more micro-devices corresponding to the one or more neutralized portions of the adhesive layer remain on the destination substrate.

Implementations may include one or more of the following features.

A third support may hold a donor substrate. The one or more actuators may be configured to provide relative motion between the first support and the third support. The controller may be configured to cause the one or more actuators to create relative motion between the donor substrate and the transfer body such that the adhesive layer on the surface of the transfer substrate contacts the plurality of micro-devices when the plurality of micro-devices are on the donor substrate so that the plurality of micro-devices adhere to the adhesive layer on the transfer body. The second support may include a robotic arm to hold the transfer body. The robotic arm may be operable to move the transfer body between the third support and the first support. The robotic arm may be operable to move the transfer body vertically relative to the first support and the third support.

The transfer body may be a transfer substrate that is removable from the second support. The second support may include a robotic arm having an end effector to releasably hold the transfer substrate.

The illumination system may include a digital mirror device having an array of individually actuatable mirrors. The digital mirror device may include a two-dimensional array of mirrors. A field of view of the illumination system may span only a portion of the transfer body, and an actuator may cause relative motion between the two-dimensional array linear array and the one or more supports. The digital mirror device may be a linear array of mirrors, and an actuator may cause relative motion between the linear array and the one or more supports.

In another aspect, a method of surface mounting micro-devices includes adhering a plurality of micro-devices on a donor substrate to a transfer surface with an adhesive layer, removing the plurality of micro-devices from the donor substrate while the plurality of micro-devices remain adhered to the transfer surface, positioning the transfer surface relative to a destination substrate so that at least some of the plurality of micro-devices on the transfer surface abut at least some of a plurality of receiving positions on the destination substrate selectively and masklessly exposing a plurality of regions of the adhesive layer on the transfer surface corresponding to a subset of micro-device to light to detach the subset of micro-devices from the adhesive layer, the subset including multiple micro-devices but less than all of micro-devices of the plurality of micro-devices, and separating the transfer surface from the destination substrate such that the subset of micro-devices remain on the destination substrate.

Implementations may include one or more of the following features.

The plurality of micro devices may include all of the micro-devices on the donor substrate. The donor substrate may be a donor substrate on which the plurality of micro-devices were fabricated.

The plurality of micro-devices may be disposed in a first array on the transfer surface, and the plurality of receiving positions may be disposed in a second array on the destination substrate. A spatial density of the first array may be greater than a spatial density of the second array. The first array may be first rectangular array with cells for the plurality of micro-devices disposed at a first pitch PX1 along a first axis and a second pitch PY1 along a second axis perpendicular to the first axis, and the second array may be a second rectangular array with the receiving positions disposed at a third pitch PX2 along the first axis and a fourth pitch PY2 along the second axis perpendicular to the first axis. The third pitch PX2 may be an integer multiple of the first pitch PX1 and the fourth pitch PY2 is an integer multiple of the second pitch PY1.

The micro-devices may include micro-LEDs. A passivating layer may be disposed over the subset of micro-devices on the destination substrate.

Selectively exposing the plurality of regions may include directing light to a digital mirror device and actuating selected mirrors of the digital mirror device to reflect light to the plurality of regions.

In another aspect, an apparatus for positioning micro-devices on a destination substrate includes a first support to hold a destination substrate, a second support to provide or hold a transfer body having a surface to receive an adhesive layer, one or more actuators configured to provide relative motion between the transfer body and the first support, a light source to generate a light beam, a mirror configured to adjustably position the collimated light beam on the adhesive layer on the transfer body, and a controller. The controller is configured to cause the one or more actuators to create relative motion such that a plurality of micro-devices attached to the adhesive layer on the transfer body contact the destination substrate, cause the light source to generate the light beam and adjust the mirror to position the light beam on the adhesive layer so as to selectively expose one or more portions of the adhesive layer to create one or more neutralized portions, and cause the one or more actuators to create relative motion such that the transfer body and the destination substrate are moved away from each other and one or more micro-devices corresponding to the one or more neutralized portions of the adhesive layer remain on the destination substrate.

Implementations may include one or more of the following features.

The transfer body may be a removable transfer substrate. The second support may include robotic arm to hold the transfer body. The robotic arm may be operable to move the body at least laterally between a third support to hold a donor substrate and the first support to hold the destination substrate.

The mirror may be a mirror in a galvo mirror scanner. The light source may be a laser and the light beam may be a laser beam.

In another aspect, a method of surface mounting micro-devices includes transferring a first plurality of micro-devices from a donor substrate to a first transfer surface, wherein transferring includes adhering the first plurality of micro-devices to a first adhesive layer on the first transfer surface, transferring the first plurality of micro-devices from the first transfer surface to a second transfer surface, wherein transferring includes adhering the first plurality of micro-devices to a second adhesive layer on the second transfer surface, releasing the plurality of micro-devices a column at a time from the first transfer surface by selectively neutralizing regions of the first adhesive layer to detach the column of micro-devices from the first adhesive layer, and moving the first transfer surface relative to the second transfer surface between transferring each column so as to establish the columns at a first pitch, transferring the first plurality of micro-devices from the second transfer surface to a desti- nation substrate, wherein transferring includes releasing the plurality of micro-devices a row at a time from the second transfer surface by selectively neutralizing regions of the second adhesive layer to detach the row of micro-devices from the first adhesive layer, and moving the second transfer surface relative to the destination substrate between transferring each row so as to establish the rows at a second pitch.

Implementations can include one or more of the following features.

Transferring the first plurality of micro-devices from the donor substrate to the first transfer surface may include transferring all of the micro-devices on the donor substrate to the first transfer surface. The first plurality of micro-devices may be less than all of the micro-devices on the donor substrate. Transferring the first plurality of micro-devices from the first transfer surface to the second transfer surface may include transferring only the first plurality of micro-devices.

The plurality of micro-devices may be disposed in a first array on the first transfer surface, and the plurality of receiving positions may be disposed in a second array on the destination substrate. A spatial density of the first array may be greater than a spatial density of the second array.

The donor substrate may be a donor substrate on which the plurality of micro-devices were fabricated. The micro-devices may be micro-LEDs. A passivating layer may be disposed over the subset of micro-devices on the destination substrate.

Selectively neutralizing the regions may include selectively exposing the regions to light. Selectively exposing the plurality of regions may include directing light to a digital mirror device and actuating selected mirrors of the digital mirror device to reflect light to the plurality of regions.

Implementations can optionally provide (and are not limited to) one or more of the following advantages. The micro-devices on the donor substrate can be built at a higher spatial density than desired for the destination substrate, thereby increasing throughput and saving wafer space when budding the micro-devices. A large number of micro-devices can be transferred in parallel from the donor substrate to the destination substrate. The transfer can be performed with high precision. Thus, yield can be increased and manufacturing time and cost can be reduced. Defective micro-devices on the donor substrate can be identified and excluded from the transfer. If micro-devices are arranged on the destination substrate at a different pitch than the donor substrate, then the number of transfer steps can be reduced relative to prior techniques.

If the micro-devices are micro-LEDs, then the technique can be used to manufacture multi-color displays, such as displays with three or more color subpixels. Flexible and/or stretchable displays can be fabricated more easily.

Other aspects, features, and advantages will be apparent from the description and drawings, and from the claims.

A variety of implementations are described below. It is contemplated that elements and features of one implementation may be beneficially incorporated in other implementations without further recitation.

BRIEF DESCRIPTION OF THE DRAWINGS

Like reference symbols in the various drawings indicate like elements.

DETAILED DESCRIPTION

In order to manufacture some devices, new techniques are needed to precisely and cost-effectively provide micro-devices on substrates, such as large area substrates or flexible substrates. For example, it would be desirable to provide an LED panel based on III-V semiconductor technology, since microLEDs have significant brightness, lifetime and efficiency advantages over organic light-emitting diode (OLED) devices.

An approach for fabricating a device that includes an array of individual micro-devices is to fabricate the micro-devices en masse on an initial substrate, and then transfer the micro-devices to the receiving or destination substrate which will form part of the product. One reason to build the micro-devices on an initial substrate is that the destination substrate may be a material that is not compatible with the fabrication processes, e.g., etching and deposition, needed to form the micro-devices. For example, in the case of LEDs, deposition of the LED is an epitaxial growth process in which single crystalline gallium nitride (GaN) films are grown on sapphire wafers (sapphire wafers are used primarily due to the small lattice mismatch for GaN growth compared to other wafer materials). Another reason to build the micro-devices on initial substrate is that the micro-devices can be fabricated at higher spatial density than needed for the destination substrate, thereby increasing throughput and saving wafer real estate when building the micro-devices and consequently lowering cost.

One technique to transfer the micro-devices from the initial substrate to the destination substrate is a pick-and-place machine, e.g., a robot that transfers one micro-device at a time. However, this approach is not production worthy since it suffers from low throughput, particularly in view of the large number of micro-devices that would need to be transferred.

As the foregoing illustrates, there is a need for an improved method for manufacturing micro devices. As described below, a method for surface mounting micro-devices over a large area is disclosed. The method includes placing transfer substrate with an adhesive layer over the micro-devices on a donor substrate, adhering the adhesive layer to the micro-devices, removing the micro-devices from the donor substrate while they are adhered to the adhesive layer, aligning the micro-devices to a target locations on a destination substrate, placing the micro-devices, exposing the transfer substrate to a light source to separate the micro-devices from the transfer substrate, and moving the transfer substrate away from the micro-devices while the micro-devices remain on the transfer substrate. Micro-devices utilizing this method may be transferred to a polymer photo layer, and then transferred to the destination substrate using maskless lithography in a multitude of patterns and may be transferred to a wide variety of substrates.

Moreover, the micro-devices can be selectively released from the adhesive layer using a maskless lithography techniques. In contrast to a masked projection of light onto the adhesive layer, a maskless technique is adaptable to different release patterns, has a lower cost because it is not necessary to make a new mask for each release strategy, and is faster because time to fabricate the mask is not required.

Figure 1:
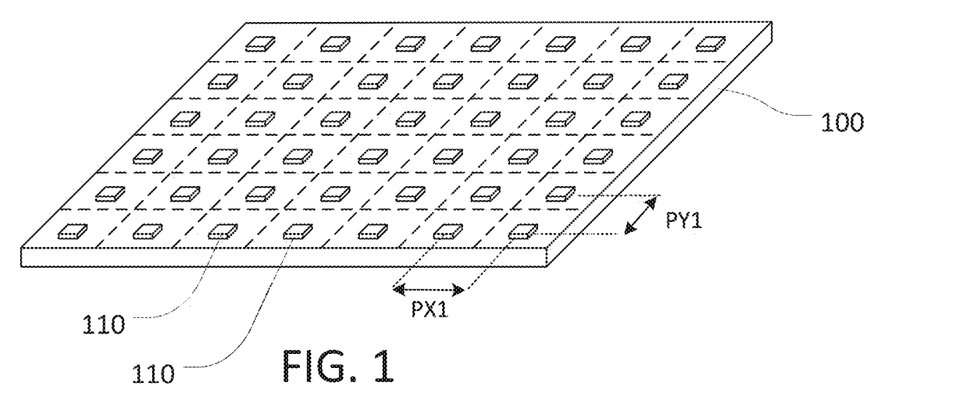
FIG. 1 is a schematic perspective view of a donor substrate with an array of micro-devices.

FIG. 1 illustrates a donor substrate 100 with an array of micro-devices 110. The micro-devices 110 are small electronic elements, e.g., light-emitting diodes (LEDs), and integrated circuit chips such as logic ICs, processors, memory, controllers, etc. The micro-devices 110 are micron-scale devices, e.g., with a maximum lateral dimension of about 1 to 100 microns. For example, the devices can have a lateral dimension of about 1-50 microns, e.g., 5-50 microns, e.g., 10-30 microns. The micro-devices 110 can be identical, i.e., same dimensions, circuit pattern and layer structure.

Although FIG. 1 illustrates the micro-devices 110 in a regular rectangular array with pitch PX1 and PY1 in the two perpendicular directions parallel to the face of the donor substrate, other array configurations are possible, e.g., staggered rows.

The micro-devices 110 can be fabricated directly on the donor substrate 100, or the micro-devices 110 could have been fabricated on another substrate, e.g., a device substrate and then transferred to the donor substrate 100 without changing their pitch. For example, the micro-devices can be fabricated at relatively high density on the device substrate, and the donor substrate 100 can be an adhesive tape that is placed in contact with the devices. Then the device substrate can be removed or singulated so that each micro-device 110 is individually attached to the donor substrate, e.g., the tape.

Figure 2:
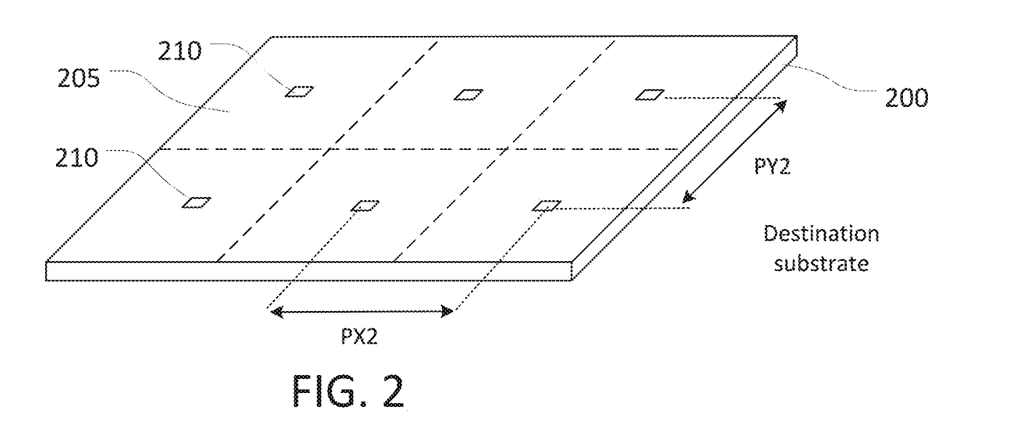
FIG. 2 is a schematic perspective view of a destination substrate.

FIG. 2 illustrates a destination substrate 200 with an array of cells 205, each of which has a spot 210 to receive a micro-device 110. Thus, the spots 210 are also arranged in an array. However, the spacing of the array of spots 210 on the destination substrate 200 can differ from the spacing of the micro-devices 110 on the donor substrate 100. Typically, the spacing between the spots 210 is larger than the spacing between the micro-devices 110 on the donor substrate 100. For example, FIG. 2 illustrates the spots 210 in a rectangular array with pitch PX2 and PY2 in the two perpendicular directions parallel to the face of the destination substrate 200. Thus, the pitch PX2 can be greater than the pitch PX1 and the pitch PY2 can be greater than the pitch PY1. As noted above, other array configurations are possible, e.g., staggered rows. Since the spacing between the spots 210 differs from the spacing between the micro-devices 110, the donor substrate 100 cannot simply be placed abutting the destination substrate 200 to transfer the micro-devices en masse.

Although not illustrated in FIG. 2, the destination substrate 100, particularly if it is the substrate that will form part of the product, can include circuitry and other components for delivering power to and/or addressing and/or controlling the micro-devices 110 when correctly secured in the spot 210. For example, each spot 210 can include one or more bond pads which will electrically connect to one or more bond pads on the micro-device 110.

Figure 11A:
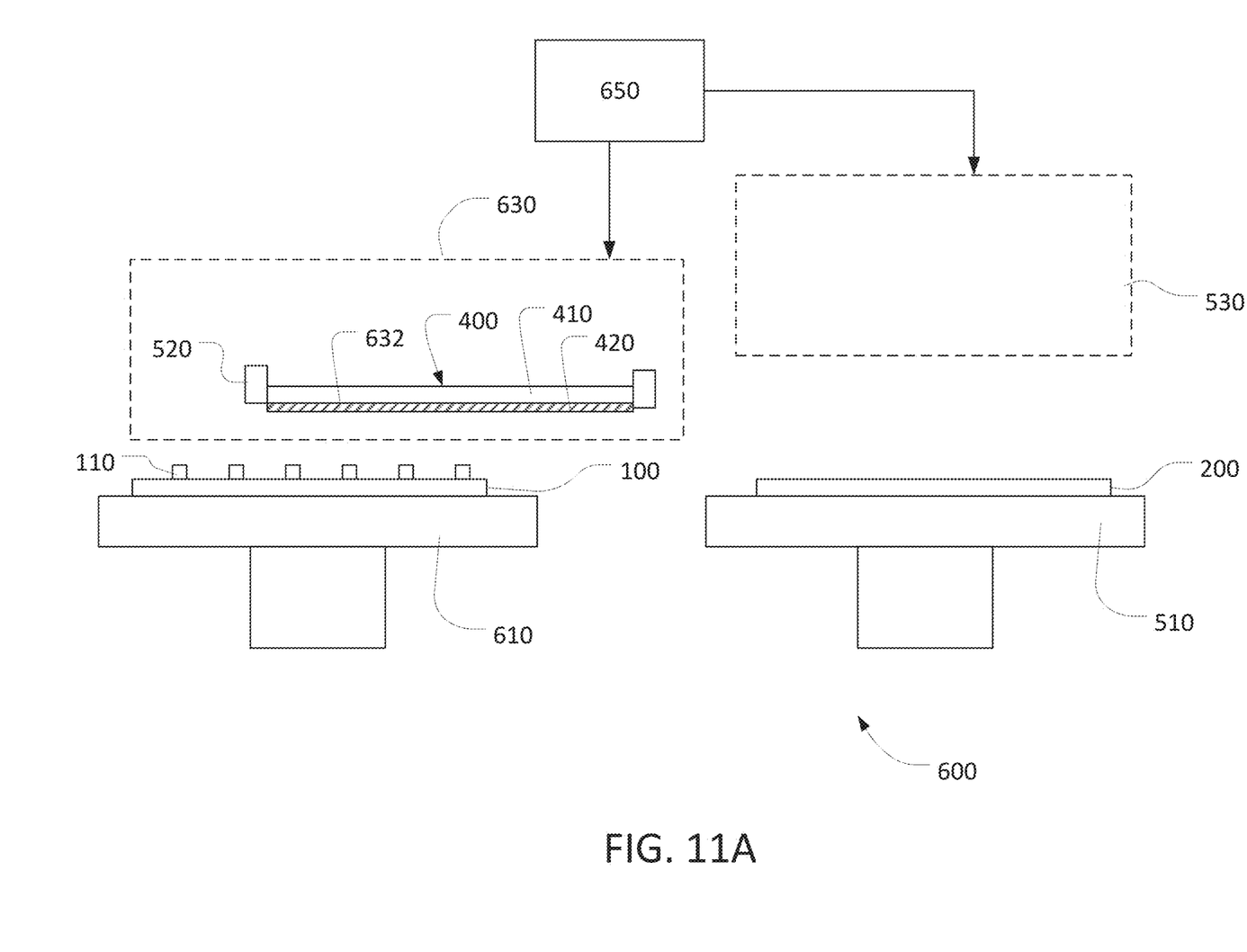
FIG. 11A is a schematic cross-sectional side view of a system for transferring micro-devices from a donor substrate to a destination substrate.

FIG. 11A is a schematic cross-sectional side view of a system for transferring micro-devices from a donor substrate to a destination substrate. FIG. 11A illustrates a system 600 for transferring the micro-devices from the donor substrate 100 to the destination substrate 200. For the purpose of discussion, the Z-axis is direction perpendicular to the plane of the substrates 100, 200, and the X-axis and Y-axis are the two perpendicular directions that are parallel to the plane of the substrates 400. Typically the Z-axis will be a vertical axis, i.e., aligned with gravity, but this is not necessary.

The apparatus 600 includes a stage 610 to support the donor substrate 100, a stage 510 to support the destination substrate 200, and transfer device 630. The transfer device 630 includes a surface 632 on which an adhesive layer 420 can be placed. The transfer device 630 can include a replaceable transfer substrate 420 on which the adhesive layer 420 is formed. Alternatively, the surface 632 can be an integral part of the transfer device 630.

The surface 632 can be planar, e.g., the bottom of a flat sheet, and can be parallel to the top surfaces of the stages 610, 510. Alternatively, the surface 632 can be cylindrical, e.g., the outer surface of a rotatable drum.

One or more actuators provide relative motion between the transfer device 630 and the stages 610 and 620. For example, the transfer device 630 can include a three-axis robotic arm 512 that can move the surface 632 along the X-axis, Y-axis and Z-axis. However, many other arrangements are possible. For example, the stages 610, 620 could be vertically movable while the arm 512 provides only Y-axis and Y-axis movement, or the stages could move along the Y-axis, etc. Assuming, the transfer device 630 includes a replaceable transfer substrate 410, the robotic arm 512 can include an end effector to hold the substrate. The end effector can be a vacuum chuck or an edge grip actuator.

The apparatus 600 also include a system to selectively "neutralize" portions of the adhesive layer 420 on the surface 632. In this context, "neutralize" includes either removing the adhesive layer entirely, e.g., by dissolving or melting, or modifying the physical property of the material so that it is no longer adhesive (also termed "denaturing"). The system can be an illumination system 530 to selectively direct light from the light source onto the back side of the body that provides the surface 632. Alternatively, the system can include individually controllable heaters embedded in the body that provides the surface 632.

A controller 650, such as a programmable computer, coordinates operation of the various components of the apparatus, e.g., the actuators and illumination system. In operation, the adhesive layer 420 on the surface 632 is lowered into contact with micro-devices 110 on the donor substrate 100, and lifted away with the micro-devices. The micro-devices 110 on the adhesive layer 420 are moved laterally over to the destination substrate 200, and lowered onto the destination substrate 200. Then the adhesive layer is neutralized in selected regions, and the surface 632 with the remaining adhesive layer 420 is lifted away from the destination substrate 200, leaving micro-devices remaining on the destination substrate at spots corresponding to regions where the adhesive layer was neutralized. Although the description above is phrased as the surface 632 providing the relative motion, it will be understood that motion of the stages 610, 620 could provide some or all of the necessary relative motion.

Figure 3:
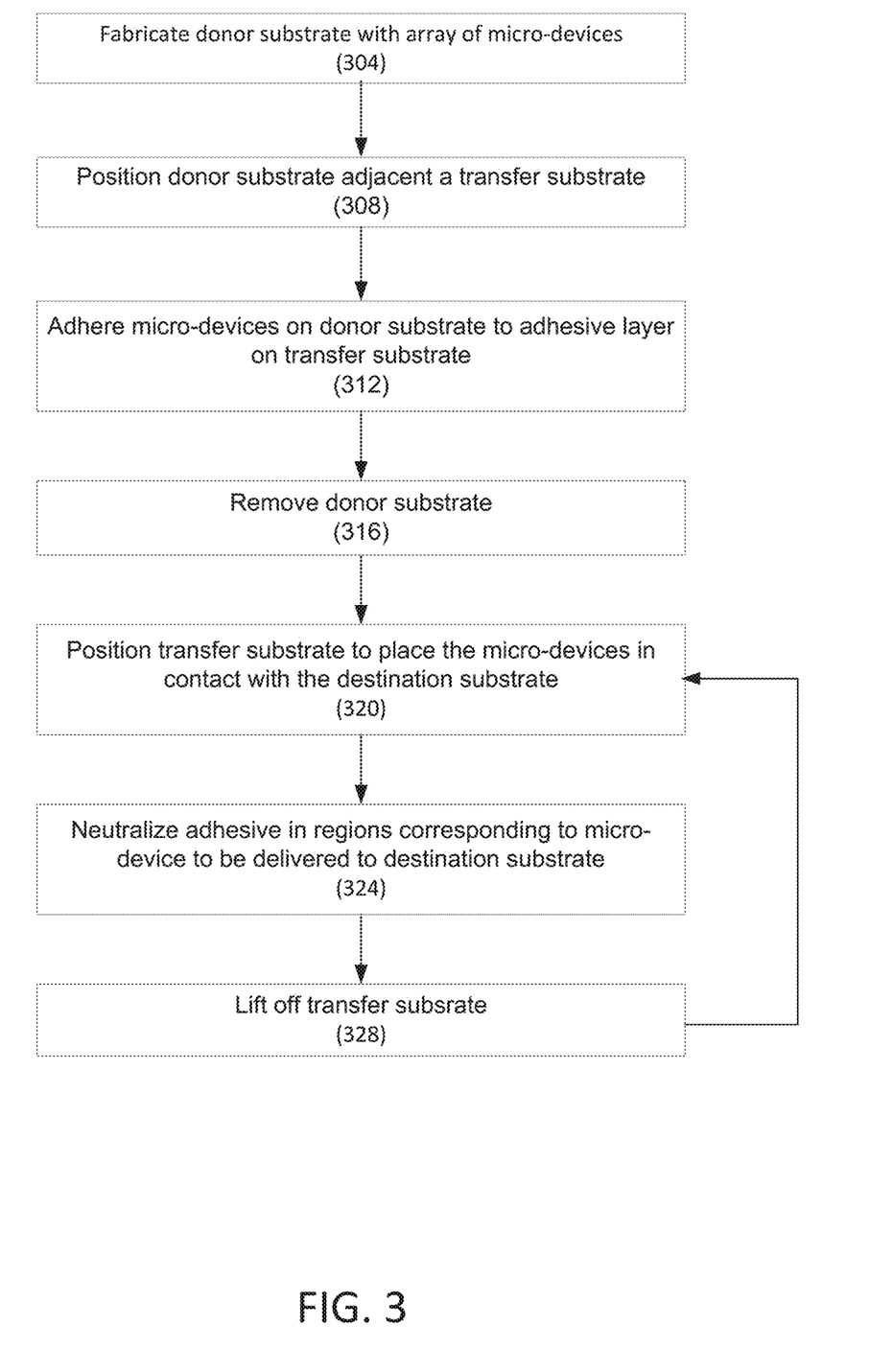
FIG. 3 is a flow diagram of a method for transferring multiple micro-devices from the donor substrate to the destination substrate.

FIG. 3 is a flow diagram of a method 300 for transferring multiple micro-devices from the donor substrate to the destination substrate. FIGS. 4-10 are schematic cross-sectional side views illustrating a method of transferring multiple micro-devices from the donor substrate to the destination substrate.

Figure 4:
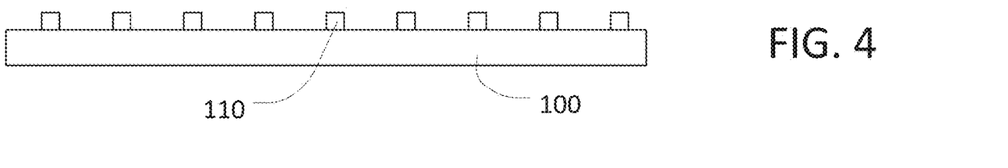
FIGS. 4-10 are schematic cross-sectional side views illustrating a method of transferring multiple micro-devices from the donor substrate to the destination substrate.

As shown in FIG. 4, the donor substrate 100 with the array of micro-devices 110 is fabricated or received from a fabrication plant (step 304).

Figure 5:
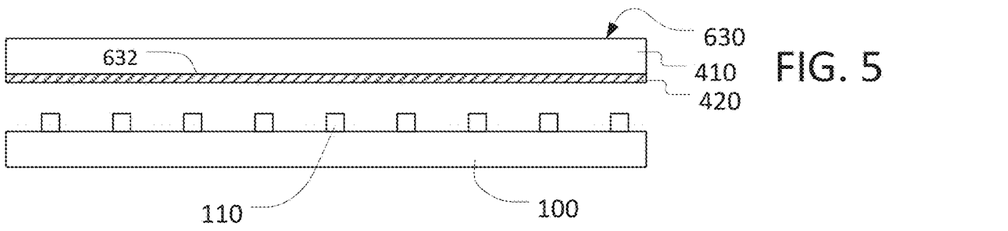

As shown in FIG. 5, the donor substrate 100 is positioned adjacent a surface 632 of a transfer device 630 (step 308). The donor substrate is oriented so that the micro-devices 110 are on the side of the donor substrate 100 facing the transfer device 630. The transfer device includes an adhesive layer 420. The adhesive layer 420 can be part of a removable transfer substrate 400. The adhesive layer 420 can be adhesive polymer, e.g., an uncured or partially cured positive photoresist.

The adhesive layer 420 extends across at least portions of the surface 632 corresponding to the array of micro-devices 110. In some implementations, the adhesive layer 420 is a continuous unitary layer spanning all of the micro-devices 110. The advantage of such a layer is that the transfer device 630 does not need to be precisely laterally positioned relative to the donor substrate 100. In some implementations, the adhesive layer 632 is segmented into a plurality of separate islands, each island corresponding to one of the micro-devices 110. However, in such implementations, the transfer device 630 will need to be laterally positioned so that the islands contact the micro-devices 110 on the donor substrate 100.

The adhesive layer 420 can be applied to the surface 632 of the transfer device 630 by spin-coating or by droplet printing. The body that provides the surface 632, e.g., the backing substrate 410, is a material, e.g., glass or quartz, that is substantially transparent to a wavelength of light that will be used to cure or dissolve the adhesive layer 420.

Although FIG. 5 illustrates the adhesive layer 420 as a continuous layer, this is not required. For example, the adhesive layer 420 could be applied in individual spots corresponding to the locations of the micro-devices 110 on the donor substrate 110, or in stripes or other patterns.

Figure 6:
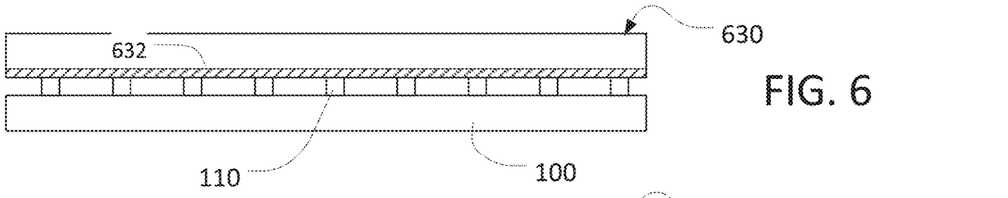

As shown in FIG. 6, the transfer device 630 is then placed adjacent the donor substrate 100 so that the micro-devices 110 adhere to the adhesive layer 420 (step 312).

As an alternative to the method shown in FIGS. 5-6, the adhesive layer 420 could be deposited directly onto the donor substrate 100 so that the adhesive material at least covers the micro-devices 110. For example, a blanket continuous layer 420 of adhesive material can be deposited across at least the array of micro-devices 110. Then the surface 632 of the transfer device 630 can be lowered into contact with the adhesive layer 420.

Figure 7:
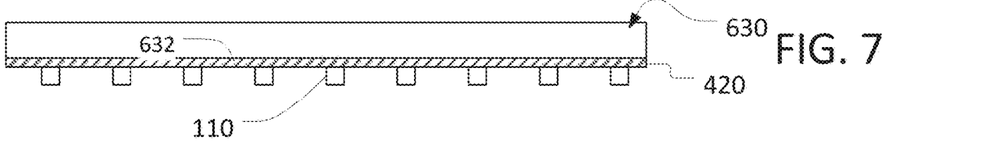

As shown in FIG. 7, the donor substrate 100 can now be removed (step 316), leaving the micro-devices 110 attached to the adhesive layer 420 on the transfer device 630. For example, an infra-red heat source, e.g., a laser, can be used to melt a region where each micro-device 110 is attached to the donor substrate 100, thus detaching the donor substrate 100 from the micro-devices 110.

Figure 8:
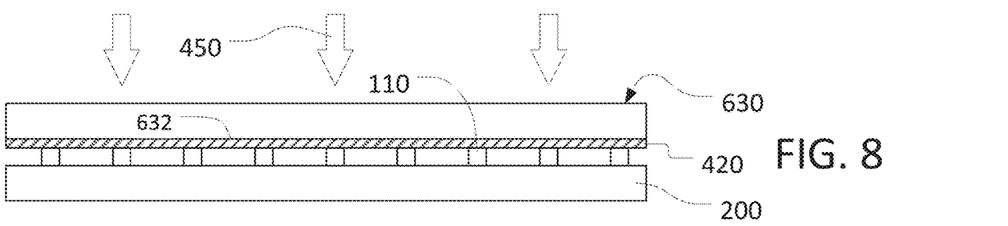

Referring to FIG. 8, the transfer device 630 can be positioned to place the micro-devices 110 in contact with the destination substrate 200 (step 320).

Figure 9:
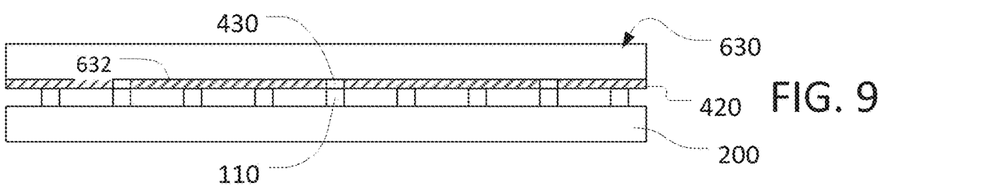

Referring to FIGS. 8 and 9, selected regions 430 of the adhesive layer 420 that correspond to micro-devices 110 desired to be delivered to the destination substrate 200 are neutralized, e.g., removed or denatured (step 324). For example, light 450 can be selectively directed through the body that provides the surface 632, e.g., the backing substrate 410, to the regions 430. The light can melt or dissolve the regions 430 of the adhesive layer 420, or cure the regions 430 into a non-adhesive composition. In some implementations, the light exposes the adhesive layer 420, and the exposed portion is removed with a developer.

Figure 11B:
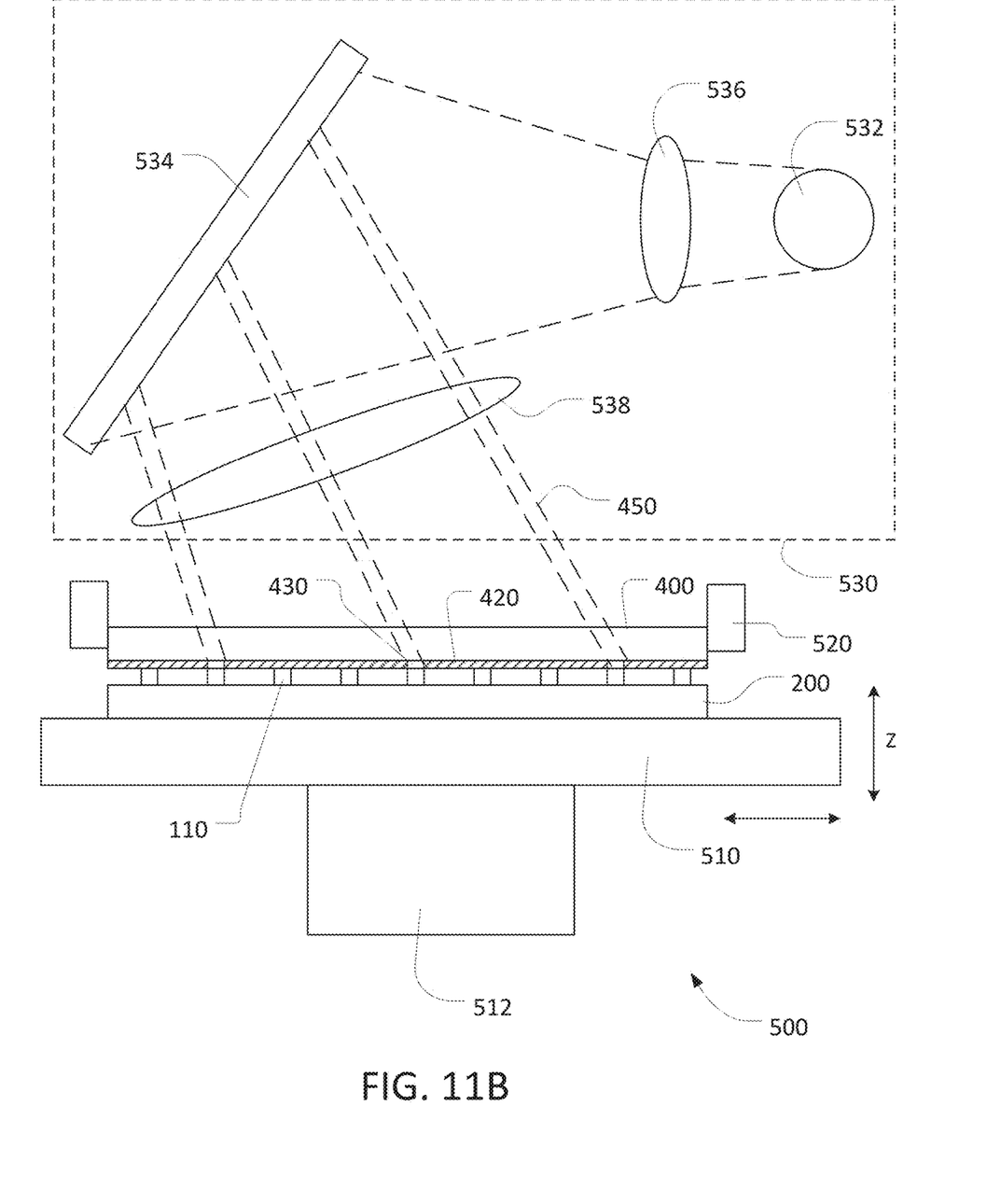
FIG. 11B is a schematic cross-sectional side view of a system for illuminating the adhesive layer on a transfer substrate.

FIG. 11B illustrates an apparatus 500 for transferring the micro-devices from the transfer substrate 400 to the destination substrate 200. For the purpose of discussion, the Z-axis is direction perpendicular to the plane of the transfer substrate 400, and the X-axis and Y-axis are the two perpendicular directions that are parallel to the plane of the transfer substrate 400. Typically the Z-axis will be a vertical axis, i.e., aligned with gravity, but this is not necessary.

The apparatus 500 includes a stage 510 to support the destination substrate 200, and holder 520, e.g., an edge grip actuator, to hold the transfer substrate 400. An actuator 512, such as a linear actuator, can provide relative motion along the Z-axis between the stage 510 and the holder 520. As illustrated, the actuator 512 can be coupled to and configured to move the stage 510 along the Z-axis while the holder 520 remains stationary, or vice-versa.

In some implementations, one or more additional actuators provide relative motion along the X-axis and Y-axis between the stage 510 and the holder 520. Again, the actuator can be coupled to and configured to move the stage 510 in the X-Y plane while the holder 520 remains stationary, or vice-versa. For example, the holder 520 can be positioned on a robot arm that provides motion in the X-Y plane.

The apparatus 500 also includes an illumination system 530. The illumination system 530 includes a light source 532 and a mechanism to selectively direct light from the light source onto the back side of the transfer substrate 400. In one implementation, the illumination system 530 includes a two-dimensional array of independently controllable mirrors, e.g., a digital micro-mirror device (DMD) 534. The illumination system 530 can also include illumination optics 536 to direct light from the light source 532 to the DMD 534, and/or projection optics 538 to direct light reflected by activated mirrors of the DMD 534 onto the adhesive layer 420. By controlling which mirrors of the DMD 534 are activated, light 450 can be selectively directed to the desired regions 430.

Figure 11C:
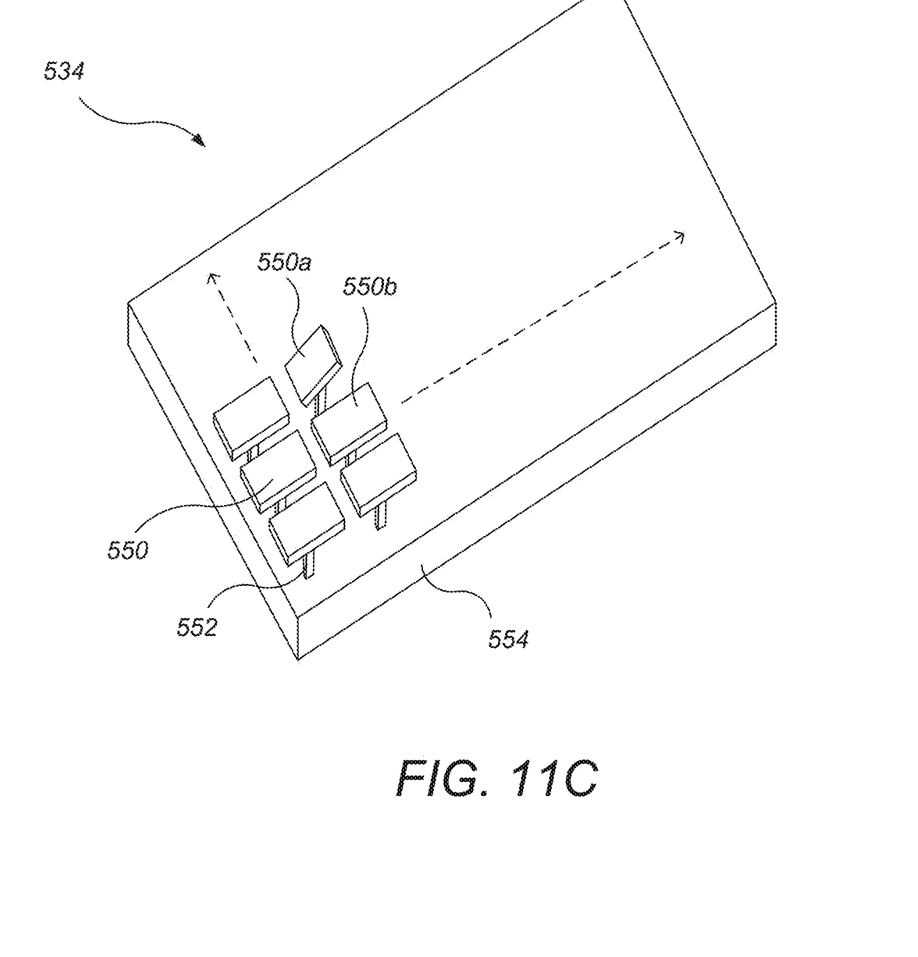
FIG. 11C is a schematic perspective view of a digital micro-mirror device.

Referring to FIG. 11C, a DMD 534 can include a plurality of independently mirrors 550. Each mirror 550 can be independently tilted between a first position, e.g., shown by mirror 550a, in which incident light from the light source 532 is reflected and passed to the projection optics 538 and illuminates a particular pixel in an imaging plane (e.g., the adhesive layer on the transfer substrate 400), and a second position, e.g., shown by mirror 550b, in which incident light from the light source 532 is reflected along a path such that the reflected light does not reach the imaging area (e.g., the adhesive layer on the transfer substrate 400). The mirrors 550 can be supported on posts 552 above a substrate 554 on which circuitry is formed to control the individual mirrors 550; many other forms of DMDs are possible.

The light source 532 can be an arc lamp, e.g., a mercury arc lamp, or a laser, e.g., a solid state laser diode. One end of a bundled group of optical fibers can be coupled to one or more laser diodes; light from the other end of the optical fibers can be directed to the illumination optics 536 or sent directly to the DMD 534.

Further discussion of an illumination system that includes a DMD can be found in U.S. Patent Publication Nos. 2016/0282728, 2016,0219684 and 2016/0124316. In particular, U.S. Patent Publication No. 2016/0124316 discusses an optical system that includes an illumination-projection beam separator that could be used to direct light from the light source 532 onto DMD 534 and separate the reflected light 450.

In some implementations, the field of view of the projection optics 538 spans the entire transfer substrate 400. In this case, it is not necessary to have lateral motion between the light 450 and the transfer substrate 400. However, in some implementations, the field of view of the projection optics 538 spans only a portion of the transfer substrate 400. In this case, an actuator could provide relative motion in the X-Y plane between the illumination system 530 and the transfer substrate 400 between exposures of the transfer substrate 400.

Rather than a two-dimensional array of mirrors, the illumination system 530 could include a linear array of mirrors, and an actuator could provide relative motion in the X-Y plane between the illumination system 530 and the transfer substrate 400 to scan the linear array of mirrors across the transfer substrate 400. Alternatively, the illumination system 530 could include a linear array of mirrors, and an actuator, e.g., a galvo, could rotate the linear DMD array 534 to scan the resulting reflected light across the transfer substrate 400.

As another implementation, a light beam, e.g., from a laser, could be raster scanned across the transfer substrate 400, and modulated as it scans to provide the same function as the DMD. For example, the illumination system 430 could include a 2-axis mirror gimbal that that can rotate a single mirror about two perpendicular axes and thus scan the light beam along two perpendicular axes on the transfer substrate. As another example, the illumination system 430 could include two galvo mirror scanners in series (along the path of the light beam), that permit the light beam to be scanned along two perpendicular axes on the transfer substrate.

Figure 10:
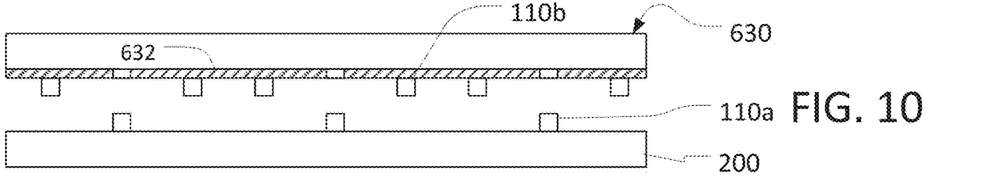
Figure 12:
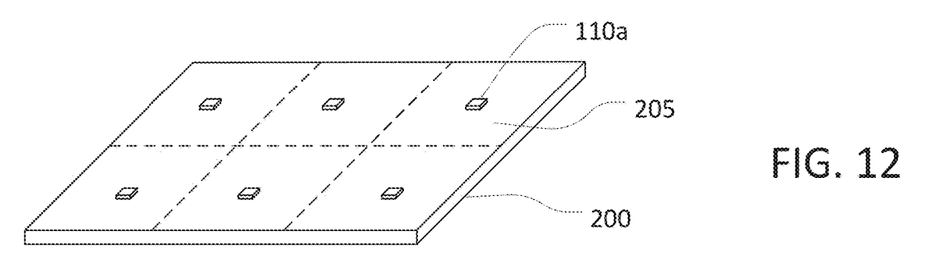
FIG. 12 is a schematic perspective view of a destination substrate having an array of micro-devices mounted thereon.
Figure 13:
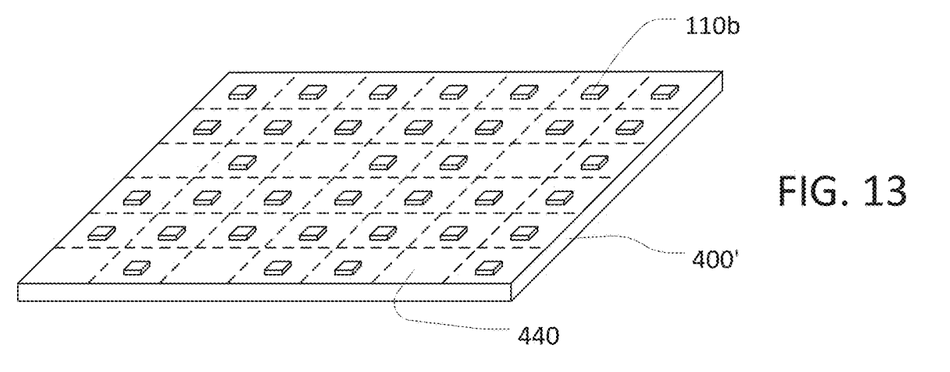
FIG. 13 is a schematic perspective view of a transfer device after some of the micro-devices have been transferred.

As shown in FIGS. 10 and 12-13, once the selected regions 430 have been illuminated, the transfer device 630 can be lifted off, leaving the selected micro-devices 110a in place on the destination substrate 200 (step 328). The remaining micro-devices 110b where the adhesive layer 430 was not exposed remain on the transfer substrate 400.

Referring to FIGS. 1-2 and 12-13, the initial spatial density of micro-devices on the donor substrate 100, and thus on the transfer device 630, is greater than the spatial density of the spots 210 on the destination substrate 200. However, assuming that the spots 210 align with particular micro-devices 110 on the transfer substrate, just those micro-devices 110 that correspond to the spots 210 can be transferred. For example, if the pitch PX2 is an integer multiple of the pitch PX1 and the pitch PY1 is an integer multiple of the pitch PX2, then one of every (PX2*PY2)/(PX1*PY1) micro-devices 110 will be transferred. For a rectangular array, the transferred micro-devices 110 can be positioned every PX2/PX1 columns and every PY2/PY1 rows.

As shown in FIG. 13, the resulting transfer device 630' will be have cells 440 that are missing micro-devices 110b. However, the transfer device 630' can be reused for additional destination substrates 200. In brief, steps 320, 324, 328 can be repeated, but with a different destination substrate and using a different set of micro-devices from the transfer device 630. That is, the transfer device 630' can be positioned adjacent the new destination substrate, but with a different set of micro-devices aligned with the spots 120. For example, the transfer device 630' can be shifted by one cell for each cycle. Ideally, for a rectangular array, this would permit the transfer device 630 to be used a total of (PX2*PY2)/(PX1*PY1) times.

Figures 14, 15:
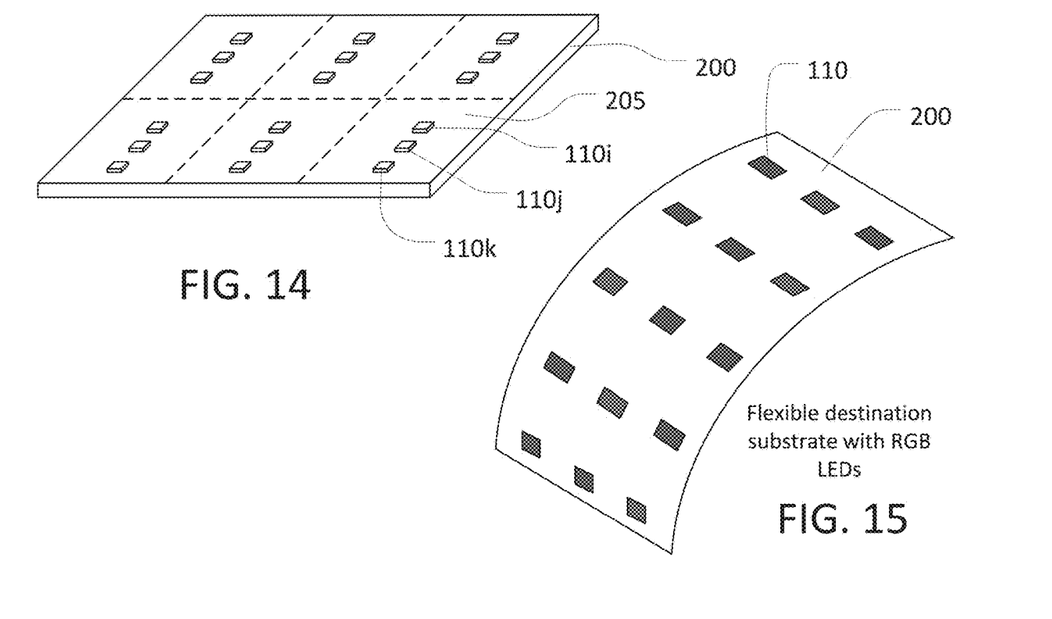
FIG. 14 is a schematic perspective view of a destination substrate having multiple micro-devices per cell.
FIG. 15 is a schematic perspective view of a flexible substrate on which micro-LEDs have been mounted.

As shown in FIG. 14, some products may need multiple micro-devices 110i, 110j, 110k of different types in each cell 205. For example, for a color LED display may need three micro-LEDs, one for each of red, blue and green. Each micro-LED can provide a sub-pixel. A variety of patterns are possible for the sub-pixels. For example, the different colored sub-pixels can simply be arranged in a single row or column. Alternatively, for example, the sub-pixels within a cell can be arranged in a quincunx pattern with two sub-pixels each of two colors, e.g., red and green, and a single sub-pixel of the third color, e.g., blue (this pattern is also known as a PenTile matrix). The transfer techniques can be used to form displays with more than three color sub-pixels, e.g., a display with red, green, blue and yellow micro-LEDs.

The different color LEDs can be LEDs with phosphor layers that emit differently colored light, or they can be LEDs with different colored filter layers, or they can be LEDs that emit white light but also include an overlaying phosphor material that absorbs the white light and re-emits differently colored light (this material can be quantum dots).

The different micro-devices, e.g., the different color micro-LEDs, can be fabricated on different donor substrates at higher spatial density than needed for the destination substrate. The transfer process can then be performed for each donor substrate. That is, the micro-devices from each particular donor substrate can be transferred to its own transfer substrate. For example, there can be a transfer substrate with blue micro-LEDs, a transfer substrate with red micro-LEDs, and a transfer substrate with green micro-LEDs. For each transfer substrate, a micro-device can be transferred for each cell to the destination substrate.

As shown in FIG. 15, in some implementations, the destination substrate 200 is a flexible substrate. For example, the destination substrate 200 can be a flexible circuit and micro-devices 110 can be micro-LEDs, thus providing a flexible display screen. Alternatively or in addition, the destination substrate 200 can a stretchable substrate.

The discussion above has assumed that the donor substrate (and thus the target substrate) has a micro-device that aligns properly with the destination spot for each cell on the destination substrate. This permits all the micro-devices to be transferred from the transfer substrate to the destination substrate in a single release operation (i.e., exposing all the corresponding regions of the adhesive layer simultaneously).

However, it may be the case that the spacing between the micro-devices on the donor substrate is such that it is not possible to transfer all the micro-devices to the destination spots in a single release operation. For example, the pitch PX2 might not be an integer multiple of the pitch PX1 and/or the pitch PY1 might not be an integer multiple of the pitch PX2.

Figure 16:
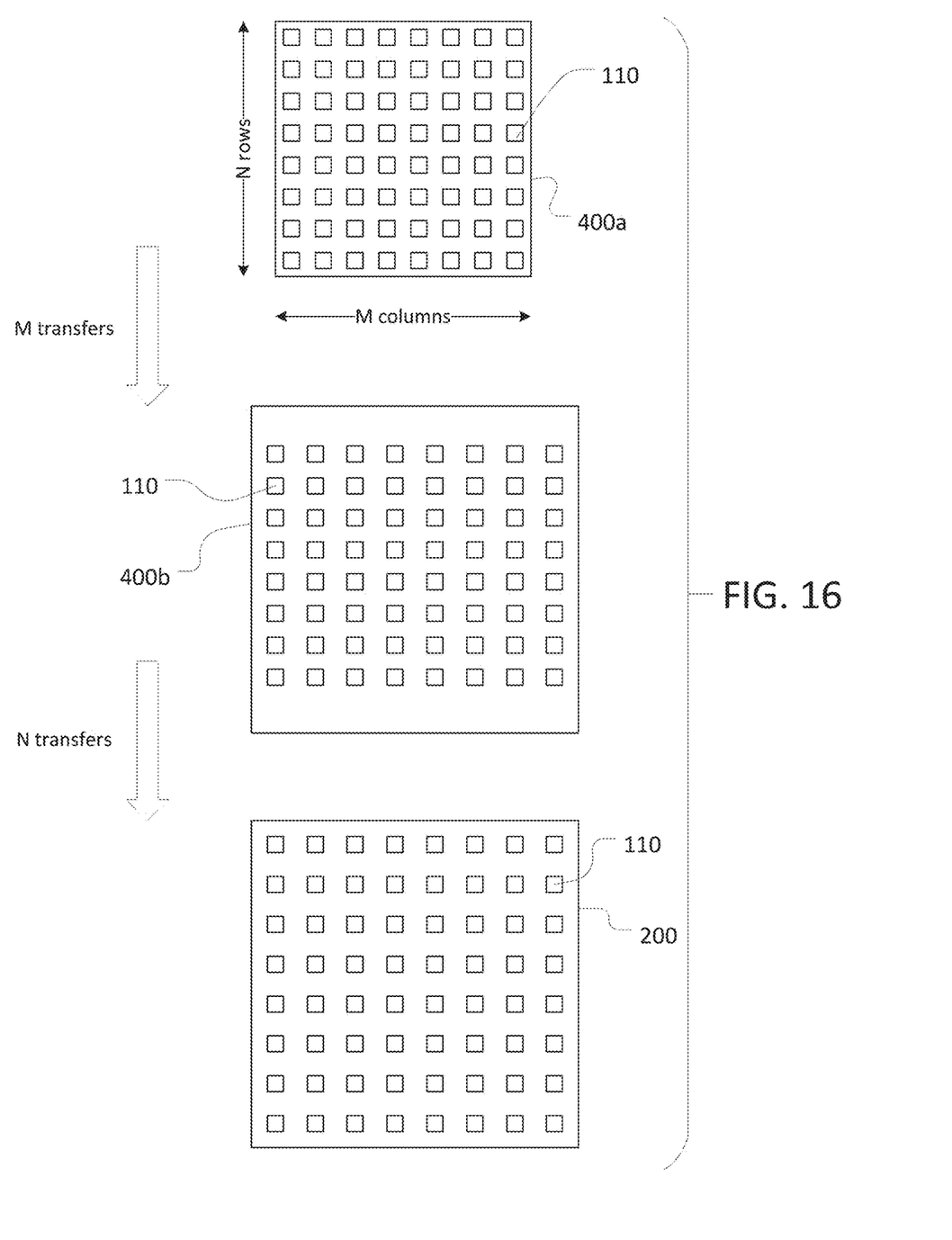
FIG. 16 is a schematic top view illustrating a multi-step transfer process.

Never-the-less, it is still possible to achieve significant increase in manufacturing throughput, at least as compared to having to pick-and-place individual micro-devices. Referring to FIG. 16, a modified process permits micro-devices to be placed in a rectangular array that has an arbitrary spacing relative to the original spacing of the micro-devices on the donor substrate.

Initially, the micro-devices 110 are transferred from a donor substrate to a a first surface of a first transfer device, e.g., a first transfer substrate 400a. The micro-devices 110 are arranged on the first transfer substrate 110 at a pitch PX1 along the X-axis and a pitch PY1 along the Y-axis. The first transfer substrate 400a is then positioned adjacent a second surface of a second transfer device, e.g., a second transfer substrate 400b. Rather than transferring all of the micro-devices at once to the second transfer substrate, a single column at a time is transferred, with the first transfer substrate undergoing lateral re-positioning between each transfer to provide the appropriate spacing in one of the directions. Then the micro-devices are transferred from the second transfer substrate to the destination substrate one row at a time, with the first transfer substrate undergoing lateral re-positioning between each transfer to provide the appropriate spacing in the other direction.

For example, supposing the destination substrate has N rows and M columns of cells to receive micro-devices 110. The first transfer substrate 400a is be positioned adjacent the second substrate 400b, and the illumination system would be controlled to illuminate regions corresponding to N micro-devices 110 within a single column. So a single column containing N micro-devices 110 would be transferred to the second transfer substrate 400b. Then the first transfer substrate 400a is shifted relative to the second transfer substrate 400b along the X-axis, and the illumination system is controlled to illuminate regions corresponding to another N micro-devices 100 within another single column, thus placing another column of N micro-devices. This process of shifting and placing is repeated M−1 times, until M columns with N rows of micro-devices are transferred to the second transfer substrate 400b. The amount of the shift of the first transfer substrate 400a relative to the second transfer substrate 400b is such that the pitch of the micro-devices along the X-axis on the second transfer substrate 400b matches the desired pitch PX2 for the destination substrate. The pitch of the micro-devices along the Y-axis can be PY1, or an integer multiple of PY1.

Once the array of M columns with N rows of micro-devices are transferred to the second transfer substrate 400b, the micro-devices 110 can be transferred to the destination substrate 200. The second transfer substrate 400b is positioned adjacent the second substrate 400b, and the illumination system is controlled to illuminate regions corresponding to M micro-devices 110 within a single row. So a single row containing M micro-devices 110 would be transferred to the destination substrate 200. Then the second transfer substrate 400b is shifted relative to the destination substrate 400b along the Y-axis, and the illumination system is controlled to illuminate regions corresponding to another M micro-devices 100 within another single row, thus placing another row of M micro-devices. This process of shifting and placing is repeated N−1 times, until N rows of M columns of micro-devices are transferred to the destination substrate 200. The amount of the shift of the second transfer substrate 400b relative to the destination substrate 200 is such that the pitch of the micro-devices along the Y-axis on the destination substrate 200 matches the desired pitch PY2 for the destination substrate 200. As a result, the pitch of the micro-devices on the destination substrate is now PX2 along X-axis and PY2 along Y-axis, with any arbitrary relationship between PX1 and PX2, and between PY1 and PY2.

An advantage of this multi-step transfer process is that the total number of transfer steps is approximately M+N. While for a high resolution display this total M+N may still be a large number, it is much smaller than the number of transfer steps that would be required for individual pick-and-place, i.e., M*N.

In some implementations, the micro-devices are inspected or tested before being transferred to the destination substrate. Testing might occur while the micro-devices are still on the donor substrate, or inspection might occur while the micro-devices are on the transfer substrate. For each cell where inspection or testing indicates that the micro-device is defective, the illumination system of the transfer system is controlled to not illuminate the region of the transfer substrate corresponding to the defective micro-device. Thus, the identified defective micro-devices are not transferred to the destination substrate. Any cell on the destination substrate that thus lacks a micro-device can receive a functional micro-device in a later pick-and-place operation. This permits the destination substrate, and thus the product, to be fabricated with very high yield.

For some implementations, depending on which side of the micro-device is required to contact the destination substrate, it may be necessary to transfer the micro-devices to a third transfer substrate (which could be before the first transfer substrate, after the second transfer substrate, or between the first and second transfer substrates) in order to flip the micro-devices.

It should be understood that while the above method described a method of surface mounting a single micro device, the method can include more than one micro device.

The controller can be implemented in digital electronic circuitry, or in computer software, firmware, or hardware, or in combinations of them. The controller can include one or more computer program products, i.e., one or more computer programs tangibly embodied in an information carrier, e.g., in a non-transitory machine readable storage medium or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method of surface mounting micro-devices, comprising:
    adhering a first plurality of micro-devices on a donor substrate to a transfer surface with an adhesive layer;
    removing the first plurality of micro-devices from donor substrate while the first plurality of micro-devices remain adhered to the transfer surface;
    positioning the transfer surface relative to a destination substrate so that a subset of the first plurality of micro-devices on the transfer surface abut a plurality of receiving positions on the destination substrate, the subset including multiple micro-devices but less than all of micro-devices of the first plurality of micro-devices;
    directing a light beam to a mirror and adjusting a position of the mirror so as to adjust a position of a light beam on the adhesive layer and selectively expose one or more portions of the adhesive layer to create one or more neutralized portions; and
    separating the transfer surface from the destination substrate such that one or more micro-devices corresponding to the one or more neutralized portions of the adhesive layer remain on the destination substrate.

2. The method of claim 1, wherein the first plurality of micro devices comprise all of the micro-devices on the donor substrate.

3. The method of claim 1, wherein the first plurality of micro devices comprise less than all of the micro-devices on the donor substrate.

4. The method of claim 1, wherein the first plurality of micro-devices are disposed in a first array on the transfer surface, and the plurality of receiving positions are disposed in a second array on the destination substrate.

5. The method of claim 4, wherein the donor substrate is a donor substrate on which the first plurality of micro-devices were fabricated.

6. The method of claim 1, wherein the micro-devices comprise micro-LEDs.

7. The method of claim 1, wherein the light beam comprises a laser beam.

8. The method of claim 1, wherein the light beam dissolves or melts the one or more portions of the adhesive layer to create the one or more neutralized portions.

9. The method of claim 1, wherein the light beam denatures the one or more portions of the adhesive layer to create the one or more neutralized portions.

10. The method of claim 1, comprising raster scanning the light beam across the adhesive layer while modulating the light beam to selectively expose the one or more portions of the adhesive layer.

11. The method of claim 1, wherein the light beam melts or dissolves the one or more portions of the adhesive layer to form the one or more neutralized portions.

12. The method of claim 1, wherein the light beam cures the one or more portions of the adhesive layer into a non-adhesive composition to form the one or more neutralized portions.

13. The method of claim 1, further comprising disposing a passivating layer over the one or more micro-devices on the destination substrate.

14. The method of claim 1, wherein positioning the transfer surface comprises moving a transfer substrate from a position adjacent to the donor substrate to a position adjacent the destination substrate.

15. The method of claim 14, wherein moving the transfer substrate comprises moving the transfer substrate with a robot arm.

16. The method of claim 1, wherein the mirror comprises a 2-axis mirror galvo mirror scanner.

\* \* \* \* \*